United States Patent [19]

Kellner et al.

[11] Patent Number: 4,808,365
[45] Date of Patent: Feb. 28, 1989

[54] METHOD FOR REDUCING EDGE CURL ON GREEN SHEETS

[75] Inventors: Benedikt M. J. Kellner, Wappingers Falls; Salvatore J. Scilla, Marlboro, both of N.Y.

[73] Assignee: International Business Machines Corporation, Armonk, N.Y.

[21] Appl. No.: 199,214

[22] Filed: May 26, 1988

Related U.S. Application Data

[63] Continuation of Ser. No. 923,060, Oct. 24, 1986, abandoned.

[51] Int. Cl.$^4$ ............... B29C 71/00; C04B 41/81; F26B 21/08; F27D 7/02
[52] U.S. Cl. ........................... 264/343; 34/34; 34/50; 264/58; 264/61; 264/65; 264/344; 264/DIG. 39
[58] Field of Search ....... 264/344, 343, 340, DIG. 39, 264/65, 82, 232, 58, 61; 34/196, 34, 50

[56] References Cited

U.S. PATENT DOCUMENTS

| | | | |
|---|---|---|---|
| 2,274,426 | 2/1942 | Miller | 34/50 |
| 3,148,955 | 9/1964 | Nichols | 34/50 |
| 3,953,562 | 4/1976 | Hait et al. | 264/63 |
| 4,340,436 | 7/1982 | Dubetsky et al. | 156/89 |
| 4,497,677 | 2/1985 | Sanada et al. | 156/89 |

FOREIGN PATENT DOCUMENTS

| | | |
|---|---|---|
| 134080 | 2/1979 | German Democratic Rep. . |
| 217610 | 1/1985 | German Democratic Rep. .... 34/50 |
| 241251 | 9/1985 | German Democratic Rep. . |

*Primary Examiner*—Jan H. Silbaugh
*Assistant Examiner*—Karen D. Kutach
*Attorney, Agent, or Firm*—John D. Crane

[57] ABSTRACT

A process for reducing edge curl in green sheets in which the sheets are first placed in a chamber at about 95% relative humidity for a period of about 2 weeks at room temperature. In this part of the process, the sheets absorb water which causes the internal stresses in the green sheet to relax. Thereafter, the sheets are dried by placing them in a chamber at about 35% relative humidity for a period of about 1 week at room temperature. In this period, the absorbed water evaporates and the green sheets become firm with less edge curl than they exhibited prior to the treatment.

13 Claims, No Drawings

METHOD FOR REDUCING EDGE CURL ON GREEN SHEETS

This is a continuation of U.S. application Ser. No. 923,060, filed Oct. 24, 1986, now abandoned.

BACKGROUND OF THE INVENTION

The present invention relates primarily to the field of manufacturing of semiconductor devices and particularly to the field of producing unfired ceramic sheets, used in making ceramic substrates, which can be processed by automated equipment.

In the manufacture of ceramic sheets for use in making VLSI circuits, a slurry is first made which consists of ceramic particles such as alumina or glass particles which are suspended in an organic solution containing an organic binder including plasticizers. The slurry is then deposited in a thin layer on a backing web made, for example, of MYLAR flexible polyester film material (MYLAR is a registered trademark of E. I. DuPont De Nemours & Co. of Wilmington, Del.). The slurry on the web then passes under a forced air dryer to drive off the solvents in the slurry thereby leaving a thin layer (ca. 5 to 30 mils in thickness) of unfired ceramic material embedded in a solid organic matrix. The ceramic-containing layer is subsequently separated from the backing web and wound in the form of an unfired ceramic web onto a spool. Thereafter, the spooled unfired ceramic web is cut into small sheets which are preferably loaded into a cartridge which holds and separates a plurality of such sheets which are referred to as "green sheets", a generic term used to describe a ceramic sheet prior to firing or sintering.

It is also known that green sheets are unstable as has been noted in U.S. Pat. Nos. 4,497,677 and 4,340,436. Indeed, a frequently encountered instability is that of edge curl. Green sheets frequently curl up at their edges primarily as a result of the forced air dryer for removing solvents from the slurry used in making the green sheets. The extent of curling which is experienced in green sheets is related to the particular ceramic material, the organic matrix in which the ceramic material is embedded, the particular solvents which are used to make up the slurry, and the speed with which the solvents are removed from the slurry.

The curl in green sheets, if it is large enough, can cause problems with certain types of automated equipment designed for handling such green sheets. For example, a machine designed to cut the rolled unfired ceramic web into sheets has been found to be sensitive to edge curl in that the sheet transport does not work well with sheets having an edge curl greater than about 20 mils. Similar problems can occur with vacuum pickup mechanisms if the green sheet is not flat. Problems may also develop in green sheet punching if the sheet is not flat.

Various solutions have been suggested to solve the problem of edge curl on green sheets. As the edge curl is primarily caused by the speed at which solvents are removed from the slurry used in forming the web from which the green sheets are cut, one solution is to slow the speed at which the solvents are removed. This approach, however, has the disadvantage of slowing the manufacturing process used in forming the web thereby unnecessarily tying up expensive manufacturing equipment.

An alternative approach is to "iron" out the curl. In this approach, a weight is placed on the green sheets with edge curl. Then the temperature is raised for a period of time. The elevated temperature is not sufficiently high to cure the ceramic material but is sufficiently high to relax the stresses in the sheet. This approach, however, has been found to contribute to a decrease in screening stability of the sheet. Accordingly, this approach is not desirable, especially in components having high circuit density.

OBJECTS OF THE INVENTION

In view of the above mentioned problems, it is the principal objective of the present invention to provide a method for reducing edge curl in green sheets to acceptable levels so that the green sheets can be processed by automated processing equipment without difficulty.

It is still a further objective of the present invention to provide a method for reducing edge curl in green sheets to acceptable levels so that the green sheets can be processed automatically and so that the green sheets will not have increased screening instability as a result of the edge curl reduction method.

BRIEF DESCRIPTION OF THE INVENTION

The edge curl reduction method of the present invention involves first cutting sheets from the spooled web of uncured or unfired ceramic material. These sheets exhibit greater or lesser degree of edge curl, depending on the particular material involved and the manner in which the sheets are formed. The formed sheets are then placed in a tray, one on top of another. The tray is then placed in a chamber substantially at room temperature (about 22 degrees C.) at approximately 90-95% relative humidity for a period of about 2 weeks or until the internal stresses in the green sheet have been relaxed. Thereafter, the tray is placed in a chamber at room temperature at approximately 35% relative humidity for a period of about a week or until substantially all the water picked up previously has been removed from the green sheet. Once dried, the sheets will exhibit significantly less edge curl than existed at the time of the beginning of the process.

DETAILED DESCRIPTION

Green sheets, as already mentioned above, are used in the manufacture of multi-layer ceramic substrates which form a part of typical semiconductor devices currently being manufactured. As has already been noted, such green sheets quite frequently have edge curl which may inhibit the use of automated equipment to process the green sheets. The greater the edge curl that is present for a particular kind of green sheet, the more likely it is that automated equipment will experience problems using such green sheets.

In the case of the present invention, green sheets are cut into squares of about 7 inches on a side. The upper surface of the green sheet at its edge typically lies in a plane which is usually at least 10 mils higher than the plane in which the center of the upper surface of the green sheet lies. The height of the edge above the plane of the center can often be greater than 10 mils and may be as great as 100 mils or more above the plane of the center of the sheet. When the edge curl causes the edge to be at least about 10 mils above the plane of the center of a green sheet, it is quite likely that some automated equipment for handling such green sheets is likely to malfunction in processing such green sheets. This is particularly true of vacuum pickup devices which depend on the sheet to be very flat in order to work properly.

In accordance with the present invention, edge curl is reduced by treating the green sheets in the manner hereinafter described in greater detail. The green sheets are first cut into sheets which are about 7 inches square although the size is not particularly important to the present invention. However, the larger the green sheet, the more likely that edge curl will create a handling problem for some automated handling equipment.

The cut green sheets are first stacked in a tray. The bottom-most green sheet rests on a protective sheet which, in the preferred embodiment of the invention, is made of KIMDURA paper material which prevents contact with the tray (KIMDURA is a registered trademark of Kimberly-Clark Corporation). The protective sheet is very smooth and does not itself scratch the green sheet in contact therewith. The protective sheet also helps to keep the green sheets clean. A second protective sheet made of the same material as the first protective sheet is placed over the top of the green sheets in the tray to protect the upper-most green sheet from contamination. The exact material used for the protective sheet at the top and bottom of the stack of green sheets is not critical. This protective sheet is merely to protect the top and bottom green sheets from being scratched or contaminated due to contact with a contaminating substance.

The tray in the prederred embodiment has a base on which the KIMDURA paper material sheet rests and the green sheets rest thereon. Around the perimeter of the base are a plurality of posts which extend upwardly from the base and provide a means for keeping the stack of green sheets in place. The posts extend upwardly a distance which is greater than the height of the stack of green sheets plus the two KIMDURA material sheets the tray is designed to carry. This provides a measure of protection for the green sheets in the tray as trays can be stacked one on top of another without causing damage to the green sheets already in a tray. In the preferred embodiment, the trays are designed to carry about 40 green sheets, one resting on top of another.

Once the green sheets with edge curl are placed in a tray, the trays are stacked in a treatment chamber where the temperature and relative humidity is precisely controlled within a specified tolerance range. In the present invention, the temperature of the chamber is maintained at 22 degrees C. plus or minus 2 degrees C. The relative humidity in the chamber is also controlled very closely. The relative humidity is specified as 92% plus 3% and minus 2%. The trays are maintained at the specified temperature and humidity for a period of about two weeks which has been found to be sufficient to saturate with water sheets made of a glass ceramic material. If a different material is involved, the time required for the green sheets to become saturated may be different. It is also possible to achieve substantially the same results by keeping the green sheets in a controlled environment for a time less than that required to become saturated. The time required, however, is that which will result in substantially relaxing the internal stresses within the green sheets. This can only be measured by placing the green sheets in the high humidity treatment and subsequently drying the green sheet slowly and measuring the resulting edge curl. If the resulting edge curl is within the design tolerance, then the selected high humidity treatment time was sufficient. If the resulting edge curl is too great, then a longer time is required to relax the stresses in the green sheet.

The moisture picked up by the green sheets during the processing set forth above usually causes the green sheet to become limp due to its having become substantially saturated with water. Accordingly, subsequent processing of green sheets in this form is not possible. The green sheets must then be dried out in a manner which does not reintroduce edge curl which appears to have been created in the rapid drying of the slurry used in making the green sheet in the first place. In the present invention, drying of the substantially saturated sheets is accomplished by placing the trays in a chamber which is also maintained at about room temperature (22 degrees C. plus or minus 2 degrees C.). The humidity in the chamber is maintained at 35% relative humidity plus or minus 5%. The green sheets are maintained in that environment until substantially all the water which could be removed by such a treatment has been removed. In a typical application of the present method, this time period is about 1 week. Once removed from the lower humidity treatment, the green sheets can be measured for edge curl, and if the treatment parameters have been proper for the particular green sheet composition, the edge curl measured will be small enough that it is no longer a problem for automated processing machines to handle such green sheets.

The effectiveness of the above described method for treating green sheets is quite evident from the test results. Typically, edge curl in certain untreated glass ceramic sheets is in the order of about 100 mils which does give rise to severe problems in automatic handling of such green sheets subsequent to cutting the sheets. After proper treatment, however, edge curl is reduced to below 10 mils which, for most processing equipment, is sufficiently flat that automated processing equipment can move such green sheets without becoming jammed or failing to pick up a green sheet that should be moved to another processing station.

The foregoing description of the present invention has made particular emphasis on the preferred embodiment of the invention which has been described. However, it will be clear to those of skill in the art that modifications to the process can be made to the specifics of the implementation without departing from the spirit and scope of the invention as defined by the following claims. For example, the temperature and drying humidity selected could be different than that described above. The particular temperature and drying humidity selected in the present invention is substantially that of the temperature and humidity of the environment in which subsequent storage and processing occurs and it is believed that maintaining the same temperature and humidity throughout the processing is advantageous. Other changes in parameters of the present method will occur to those of skill in the art without departing from the spirit and scope of the present invention.

What is claimed is:

1. A process for reducing edge curl in ceramic green sheets comprising the steps of:
   (a) stacking at least two of said ceramic green sheets and placing said stacked ceramic green sheets into a treatment chamber maintained substantially at a selected temperature and at a selected high relative humidity of between 90% and 95% for a sufficient time to relax the stresses in said ceramic green sheets placed in said chamber and to saturate said ceramic green sheets with water; and (b) placing said saturated ceramic green sheets in a controlled enviroment at substantially a desired temperature at a relative humidity lower than said high relative humidity for a period of time required to remove from said ceramic green sheets the excess water picked up during step (a) to thereby cause said ceramic green sheets to become sufficiently rigid and free of edge curl such that subsequent machine handling of said ceramic green sheets by automated equipment is not hindered by the form of said ceramic green sheets.

2. The process of claim 1 wherein said time of treatment in said high relative humidity comprises at least 336 hours.

3. The process of claim 1 wherein said processing time in said lower relative humidity is at least 168 hours.

4. The process of claim 1 wherein said time of treatment in said high relative humidity is at least 336 hours and said time in said lower relative humidity is at least 168 hours.

5. The process of claim 1 wherein said lower relative humidity comprises substantially the relative humidity in which processing of said ceramic green sheets subsequent to edge curl removal occurs.

6. The process of claim 1 wherein said selected temperature in said high relative humidity and said lower relative humidity is between 20° and 24° C.

7. The process of claim 6 wherein said lower relative humidity comprises between 30 and 40% relative humidity.

8. The process of claim 1 wherein sai lower relative humidity comprises between 30 and 40% relative humidity.

9. The process of claim 8 wherein said time of treatment in said lower relative humidity is at least 168 hours.

10. The process of claim 1 wherein said selected temperature is defined as substantially 22° C.

11. The process of claim 10 wherein said processing time in said lower relative humidity is at least 168 hours.

12. The process of claim 10 wherein said time of treatment in said high relative humidity comprises at least 336 hours.

13. The process of claim 12 wherein said processing time in said lower relative humidity is at least 168 hours.

* * * * *